(12) United States Patent
Fogarty et al.

(10) Patent No.: US 12,222,393 B2
(45) Date of Patent: *Feb. 11, 2025

(54) SYSTEMS AND METHOD FOR MANAGING DISPATCH AND LIFECYCLE OF ENERGY STORAGE SYSTEMS ON AN ELECTRICAL GRID, INCLUDING MANAGEMENT OF ENERGY STORAGE SYSTEMS FOR PROVISIONING OF MULTIPLE SERVICES

(71) Applicant: Jupiter Power, LLC, Austin, TX (US)

(72) Inventors: Audrey Fogarty, Chicago, IL (US); Martin P. Downey, Jr., Montgomery, TX (US); Mandhir S. Sahni, Irving, TX (US); Andrew Bowman, Austin, TX (US)

(73) Assignee: Jupiter Power LLC, Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/488,596

(22) Filed: Oct. 17, 2023

(65) Prior Publication Data

US 2024/0044986 A1 Feb. 8, 2024

Related U.S. Application Data

(63) Continuation of application No. 16/845,984, filed on Apr. 10, 2020, now Pat. No. 11,789,082.
(60) Provisional application No. 62/832,039, filed on Apr. 10, 2019.

(51) Int. Cl.
  *G01R 31/36* (2020.01)
  *G01R 31/364* (2019.01)
  *H01M 10/44* (2006.01)

(52) U.S. Cl.
  CPC .......... *G01R 31/364* (2019.01); *H01M 10/44* (2013.01)

(58) Field of Classification Search
  CPC ............................ G01R 31/364; H01M 10/44
  USPC ....................................................... 320/132
  See application file for complete search history.

(56) References Cited

U.S. PATENT DOCUMENTS

| | | | |
|---|---|---|---|
| 9,711,987 B2* | 7/2017 | Choi | H02J 7/0063 |
| 2016/0111920 A1* | 4/2016 | Pignier | H02J 7/0068 307/23 |
| 2021/0046839 A1* | 2/2021 | Logvinov | B60L 53/63 |

* cited by examiner

*Primary Examiner* — Nathaniel R Pelton

(57) ABSTRACT

Systems and methods for managing dispatch of an energy storage system through use of projected outcomes. The projected outcomes are generated based on a model that includes a set of defined operating states. The operating states represent a particularized energy-market allocation approach. An outcome is projected for each operating state. An optimal outcome is selected from the set of projected outcomes.

19 Claims, 14 Drawing Sheets

Figure 6

| Parameter | Unit | Descriptor | Source |
|---|---|---|---|
| Nameplate MW | MW | Installed BES energy | Entered by User |
| Available Duration | Minutes | Available duration for Energy Arbitrage | Calculation |
| Nameplate MWh | MWh | Installed BES energy | Entered by User |
| Available MWh | MWh | Available MWh for Energy Arbitrage | Calculation |
| Round-trip-Efficiency | % | AC-to-AC Energy Arbitrage losses | Entered by User |
| State of Charge 'SoC' % | % | % of Available MWh remaining | Calculation |
| State of Charge 'SoC' MWh | MWh | Absolute Available MWh remaining | Calculation |
| State of Charge range | % | MAX/MIN limits on SoC % | Entered by User |
| State of Charge MAX/MIN | MWh | MAX/MIN limits on SoC-MWh | Entered by User |
| Cycles/day | Number | Amount of cycles allowed/day | Entered by User |
| SoC counter | Number | No of intervals (hourly/5-mins) with BES activity | Calculation |

Figure 7

| Operating State | Definition |
|---|---|
| Note 1: | All Operating States #1 - #6 envisage that the first hour in the Energy Markets is a Charge-hour – i.e. the BES must buy energy before it can sell energy.<br><br>All Charging/Discharging activity after the first Charging hour is determined by the operating constraints. |
| 1 | - Buy (Charge) DA-Energy for all Available Duration hours<br>- Sell (Discharge) DA-Energy for all Available Duration hours<br>- Select AS-markets for remaining hours in the day |
| 2 | - Allocate a % of MWs to buy/sell in the DA-Market for Available Duration hours<br>- Allocate a % of capacity to buy/sell in the RT-Market for Available Duration hours<br>- The % of MWs allocated to the DA-Market is applied to the AS-market allocation for the remaining hours in the day |
| 3 | - RT-only (charging prior to discharging)<br>- Buy/Sell all MWs in the RT-Energy market up to the Available Duration hours s.t. pricing constraints<br>- No Ancillary Service market allocation |
| 4 | - Buy RT-Energy for all Available Duration hours<br>- Sell DA-Energy for all Available Duration hours<br>- Select AS-markets for remaining hours in the day |
| 5 | - Buy DA-Energy for all Available Duration hours<br>- Sell DA-Energy up to all Available Duration hours<br>- Select AS-markets for remaining hours in the day |
| 6 | - Select AS-markets for all hours of the day |
| 8 | - Buy (Charge) DA-Energy for all Available Duration hours<br>- Sell (Discharge) DA-Energy for all Available Duration hours<br>- No AS-market allocation |
| Note 2: | All Operating States #9 - #13 envisage that the first hour in the Energy Markets is a Discharge-hour – i.e. the BES must sell energy before it can buy energy.<br><br>All Discharging/Charging activity after the first Discharging hour is determined by the State of Charge counter and posted Prices |
| 9 | - RT-only (discharging prior to charging)<br>- Buy/Sell all MWs in the RT-Energy market up to the Available Duration hours s.t. pricing constraints<br>- No Ancillary Service market allocation |
| 10 | - Sell DA-Energy for all Available Duration hours<br>- Buy RT-Energy for all Available Duration hours<br>- Select desired AS-markets for remaining hours in the day |
| 11 | - Sell RT-Energy up to all Available Duration hours<br>- Buy DA-Energy for all Available Duration hours<br>- Select AS-markets for remaining hours in the day |
| 12 | - Sell DA-Energy for all Available Duration hours<br>- Buy DA-Energy for all Available Duration hours<br>- Select AS-markets for remaining hours in the day |
| 13 | - Sell DA-Energy for all Available Duration hours<br>- Buy RT-Energy for all Available Duration hours<br>- No AS-market allocation |
| 14 | - Allocate a % of MWs to buy/sell in the DA-Market for Available Duration hours<br>- Allocate a % of capacity to buy/sell in the RT-Market for Available Duration hours |

Figure 8

| Op. State | RT-Charge Energy (MW) | RT-Discharge Energy (MW) | DA-Charge Energy (MW) | DA-Discharge Energy (MW) | AS-Charge Capacity (MW) | AS-Discharge Capacity (MW) |
|---|---|---|---|---|---|---|
| 1 |  |  | ✓ | ✓ | ✓ | ✓ |
| 2 | ✓ | ✓ | ✓ | ✓ | ✓ | ✓ |
| 3 | ✓ | ✓ |  |  |  |  |
| 4 | ✓ |  |  | ✓ | ✓ | ✓ |
| 5 |  | ✓ | ✓ |  | ✓ | ✓ |
| 6 |  |  | ✓ |  | ✓ | ✓ |
| 8 |  | ✓ | ✓ |  |  |  |
| 9 | ✓ | ✓ |  |  |  |  |
| 10 | ✓ |  | ✓ | ✓ | ✓ | ✓ |
| 11 |  | ✓ | ✓ |  | ✓ | ✓ |
| 12 |  |  | ✓ | ✓ | ✓ | ✓ |
| 13 | ✓ | ✓ |  |  |  |  |
| 14 |  | ✓ | ✓ | ✓ | ✓ | ✓ |

Figure 9

| Parameter | User Input | Metric | Calc | Output for Model parameter | Metric | |
|---|---|---|---|---|---|---|
| Technical Parameters | | | | | | |
| Nameplate POI Capacity | X | | | | MW | |
| Nameplate MWhs | Q | | | | MWh | |
| Nameplate Duration | | | Q/X*60 | Z | mins | |
| State of Charge range | u | % | | | | |
| Available Duration | | | u*Z | Y | mins | |
| Efficiency Factor | w | % | | | | |
| SoC counter MAX | | | Y/5 | V | | |
| SoC counter | T (calculated from previous-day Operating State) | | | | | |
| % Next-day Charging-Capacity carry-over | | | (1-T)/V | t | % | |
| | | | | | | |
| Market Parameters | | | | | | |
| AS-1 Charge Energy allowance | A | mins | A/Y | a | % | |
| AS-1 Discharge Energy allowance | B | mins | B/Y | b | % | |
| AS-2 Charge Energy allowance | C | mins | C/Y | c | % | |
| AS-2 Discharge Energy allowance | D | mins | D/Y | d | % | |
| AS-3 Charge Energy allowance | E | mins | E/Y | e | % | |
| AS-3 Discharge Energy allowance | F | mins | F/Y | f | % | |
| | | | | | | |
| AS-1 Charge Capacity factor | s | % | | | | |
| AS-1 Discharge Capacity factor | r | % | | | | |
| AS-2 Charge Capacity factor | q | % | | | | |
| AS-2 Discharge Capacity factor | l | % | | | | |
| AS-3 Charge Capacity factor | o | % | | | | |
| AS-3 Discharge Capacity factor | n | % | | | | |
| | | | | | | |
| % of Schedule in RT-Market | α | % | | | | |
| % of Schedule in DA-market | β | % | | | | |
| % of Schedule in AS-market | δ | % | | | | |

Notes: (1) Min = minutes; (2) % of Schedule in RT/AS/DA-markets input only applies when Operating State #2 or #14 is enabled;

Figure 10

| Op. State | RT-Charge Energy (MW) | RT-Discharge Energy (MW) | DA-Charge Energy (MW) | DA-Discharge Energy (MW) | AS-1 Charge Capacity (MW) | AS-1 Discharge Capacity (MW) |
|---|---|---|---|---|---|---|
| 1 | n/a | n/a | [1-(a+c+e)]*X*t | [1-(b+d+f)]*w*X | s*X | r*X |
| 2 | α*X*t | α*w*X | β*[1-(a+c+e)]*X*t | β*[1-(b+d+f)]*w*X | δ*s*X | δ*r*X |
| 3 | X*t | w*X | n/a | n/a | n/a | n/a |
| 4 | [1-(a+c+e)]*X*t | n/a | n/a | n/a | s*X | r*X |
| 5 | n/a | [1-(b+d+f)]*w*X | n/a | n/a | s*X | r*X |
| 6 | n/a | n/a | n/a | n/a | s*X | r*X |
| 8 | n/a | w*X | X*t | n/a | n/a | n/a |
| 9 | X*t | w*X | n/a | n/a | n/a | n/a |
| 10 | [1-(a+c+e)]*X*t | n/a | n/a | [1-(b+d+f)]*w*X | s*X | r*X |
| 11 | n/a | [1-(b+d+f)]*w*X | [1-(a+c+e)]*X*t | n/a | s*X | r*X |
| 12 | n/a | n/a | [1-(a+c+e)]*X*t | [1-(b+d+f)]*w*X | s*X | r*X |
| 13 | n/a | w*X | x | n/a | n/a | n/a |
| 14 | α*X*t | α*w*X | β*[1-(a+c+e)]*X*t | β*[1-(b+d+f)]*w*X | δ*s*X | δ*r*X |

Note: AS-2 and AS-3 MW-conversion values will apply calculations similar to AS-1

Figure 11

| Time Period | TimeStamp | HE | Time Period | TimeStamp | IE |
|---|---|---|---|---|---|
| 00:00 – 01:00 | 01:00 | HE1 | 00:00-00:05 | 00:05 | IE1 |
| 01:00 – 02:00 | 02:00 | HE2 | 00:05-00:10 | 00:10 | IE2 |
| 12:00-13:00 | 13:00 | HE13 | 12:55 – 13:00 | 13:00 | IE156 |
| 23:00 – 00:00 | 00:00 | HE24 | 23:55 – 00:00 | 00:00 | IE288 |

Figure 12

| Op. State | RT-Charge Energy (MW) | RT-Discharge Energy (MW) | DA-Charge Energy (MW) | DA-Discharge Energy (MW) | AS-1 Charge Capacity (MW) | AS-1 Discharge Capacity (MW) |
|---|---|---|---|---|---|---|
| 1 | RT: x12 5-min Charge actions corresponding to DA 1-hr allocation | RT: x12 5-min Discharge actions corresponding to DA 1-hr allocation | DA: 60-min MW allocation (selected Hrs/MWs from Model calculations) | DA: 60-min MW allocation (selected Hrs/MWs from Model calculations) | DA: 60-min MW allocation RT: n/a | DA: 60-min MW allocation RT: n/a |
| 3 | RT: 5-minute Charge actions (selected Hrs/MWs from Model calculations) | RT: 5-minute Discharge actions (selected Hrs/MWs from Model calculations) | n/a | n/a | n/a | n/a |
| 4 | RT: 60-min MW allocation (selected Hrs/MWs from Model calculations) Converted into: Up to x12 5-min RT-Charge actions corresponding to RT 1-hr allocation (where RT-operating conditions are satisfied) | RT: x12 5-min Discharge actions corresponding to DA 1-hr allocation | n/a | DA: 60-min MW allocation (selected Hrs/MWs from Model calculations) | DA: 60-min MW allocation RT: n/a | DA: 60-min MW allocation RT: n/a |
| 5 | RT: x12 5-min Charge actions corresponding to DA 1-hr allocation | RT: 60-min MW allocation (selected Hrs/MWs from Model calculations) Converted into: x12 5-min RT-Discharge actions corresponding to RT 1-hr allocation (where RT-operating conditions satisfied) | DA: 60-min MW allocation (selected Hrs/MWs from Model calculations) | n/a | DA: 60-min MW allocation RT: n/a | DA: 60-min MW allocation RT: n/a |
| 6 | n/a | n/a | n/a | n/a | DA: 60-min MW allocation RT: n/a | DA: 60-min MW allocation RT: n/a |
| 8 | RT: x12 5-min Charge actions corresponding to DA 1-hr allocation | RT: 5-minute Discharge actions (selected Hrs/MWs from Model calculations) | DA: 60-min MW allocation (selected Hrs/MW from Model calculations) | n/a | n/a | n/a |

Figure 13

| Price dataset | Time Interval | Application |
|---|---|---|
| Day-Ahead Market ($p_{DA}$) | Hourly | Unique BES location price |
| Real-time Market | Hourly (based on hourly forecast OR 5-min aggregation) | Unique BES location price |
| Hour-Ahead Energy* ($p_{HA}$) | Hourly | Unique BES location |
| Real-time Energy ($p_{RT}$) | 5 minutes | Unique BES location price |
| Real-time Settlement | 15-mins | Unique BES location price |
| Ancillary Service-1 $p_{AS1}$ | Hourly | Specific ISO-wide price |
| Ancillary Service-2 $p_{AS2}$ | Hourly | Specific ISO-wide price |
| Ancillary Service-3 $p_{AS3}$ | Hourly | Specific ISO-wide price |
| Ancillary Service-xx | Hourly | Specific ISO-wide price |
| Day-Ahead Energy Hub | Hourly | ISO regional price |
| Real-time Energy Hub | Hourly (based on hourly forecast OR 5-min aggregation) | ISO regional price |

Figure 14

| Strike Price determination | Charging MWh from DA-Market | Charging MWh from RT-market |
|---|---|---|
| Discharge Average Strike Price | = Average DA-charge Price + Operating Margin | = Average RT-charge price + Operating Margin |
| Discharge Maximum Strike Price | = Maximum DA-charge Price + Operating Margin | = Maximum RT-charge Price + Operating Margin |
| Discharge Average Discount Strike | = Average DA-charge Price + Discount Margin | = Average RT-charge Price + Discount Margin |
| Discharge Maximum Discount Strike | = Maximum DA-charge Price + Discount Margin | = Maximum RT-charge Price + Discount Margin |

SYSTEMS AND METHOD FOR MANAGING DISPATCH AND LIFECYCLE OF ENERGY STORAGE SYSTEMS ON AN ELECTRICAL GRID, INCLUDING MANAGEMENT OF ENERGY STORAGE SYSTEMS FOR PROVISIONING OF MULTIPLE SERVICES

CITATION TO PRIOR APPLICATIONS

The present application is a continuation of U.S. patent application Ser. No. 16/845,984, titled "Systems and Method for Managing Dispatch and Lifecycle of Energy Storage Systems on an Electrical Grid, Including Management of Energy Storage Systems for Provisioning of Multiple Services" which was filed Apr. 10, 2020, now U.S. Pat. No. 11,789,082 issued Oct. 17, 2023, and which claims the benefit of U.S. Provisional Application No. 62/832,039, titled "System and Method for Managing Dispatch and Lifecycle of Energy Storage Systems on an Electrical Grid, Including Management of Energy Storage Systems for Provisioning of Multiple Services" which was filed Apr. 10, 2019.

TECHNICAL FIELD

The present disclosure relates generally to electrical power distribution and the electrical grid for such power distribution. More particularly, embodiments of the present disclosure relate to the management of energy storage systems on the electrical grid, including the management of the lifecycle and state of charge (SOC) management of energy storage systems based on past, present or future conditions of the electrical grid or associated parameters. Even more specifically, embodiments of the present disclosure relate to energy storage operation in electrical grid applications, including utility-scale energy storage management within electricity markets, such that the availability and performance of energy storage systems on the grid can be optimally managed under both volatile and stable electric grid conditions.

BACKGROUND OF THE INVENTION

Before delving into more detail regarding the specific embodiments disclosed herein, some context may be helpful. Electrical grids are collections of transmission and distribution power lines interconnecting resources which generate power with loads which consume power. The operation of many electrical grids in the United States is governed by a set of Independent System Operators (ISOs) (e.g., ERCOT, PJM, MISO, NYISO, etc.) that plan and operate a respective associated grid. These ISOs are thus responsible for reliably operating and planning the associated electricity grids and the markets thereof, including the setting of price or adjustment of power placed on the grid (or consumed from the grid) and the associated market structure, which may be deregulated. It will be noted here, that while many embodiments as presented herein are given in the context or, and may be applied in, electricity markets which are operated by ISO-authorities, other embodiments may be applied in non-ISO regions or markets (e.g., where the management of the electricity grid falls under the jurisdiction of the relevant regulated utility entities or otherwise).

The operation of an electric grid under a (e.g., deregulated) market structure is defined by uncertainty in both the value of, and the magnitude of need for, power at any future time or location. This situation creates a significant information gap for energy storage resources (e.g., batteries or the like) operating in an electrical grid governed by such an electricity market, as these systems can only operate for a limited period of time in a given deployment.

The operating decisions for these systems are governed at least in part by the amount of energy available, or stored, in the energy storage resource at any point in time ("state of charge"), and by the total number of times that energy may be successfully stored and released prior to expiry of the system capabilities ("cycle-life"). It will be noted here, that a battery is but one example of such an energy storage system and that the use of the term battery herein in any context will be understood to refer more generally to all types of such energy storage systems and that such terms may be thought of as interchangeable for purposes of this disclosure.

Existing solutions for managing the operation of battery storage systems on electricity grids focus on managing a small set of parameters or predefined external operating rules, in order to predetermine in advance how the battery system will be used for a given time period. This predetermination has the effect of limiting the scope and flexibility of battery storage operation on the electrical grid and may not permit the optimal deployment of these systems either by their owners, or by ISOs tasked with managing the electricity grid.

For example, some existing solutions fix the charging and discharging time-periods for the battery system in advance, thus removing the element of uncertainty from state-of-charge management, but also removing the ability of the battery system to respond to real-time grid and market conditions. Similarly, some solutions may decide in advance which service(s) the battery system will supply in the electricity market, without taking into consideration the specific electrical grid conditions at the battery system location, which may sometimes justify a different, more effective, deployment of the battery system.

Moreover, the lifespan of batteries are steadily depleted over time due to (a) calendar life effect, and (b) the level of usage frequency and intensity. The more frequently the battery is used, and the extent to which it is operated at its maximum capacity capability, the faster the battery life declines and the more limited the possible uses of the battery. The operating decisions for these energy storage systems are thus governed at least in part, by the amount of energy available, or stored, in a battery at any point in time and by the total number of times that energy may be successfully stored and released prior to expiry of the system capabilities.

This operation and limitation of batteries thus present a problem with respect to deployment in an electrical grid. Such a situation may arise because of the typical operation of electrical grids. Specifically, system operator also called an Independent System Operator or ISO, may be responsible for operating and planning the electricity market for an electrical grid. These ISO's may thus plan for and operate multiple markets in association with the electrical grid. The markets may include, for example, the Day-Ahead market (DAM or DM), where resources commit to buy/sell hourly blocks of energy in the following day's market; the Hour-Ahead market (HA) where resources commit to buy/sell hourly blocks of energy in upcoming hours, the Real-Time market (RTM), where resources offer to make hourly blocks of energy available in the upcoming hour, where it will be bought/sold by the ISO on a time period basis (e.g., 5-minute or 15-minute basis); and the Ancillary Services (AS) market, where energy resources offer to make capacity available for select hours of the following day or for the remaining hours of the current day, and the ISO decides whether or not they wish to call on this capacity in real-time to manage real-time fluctuations in demand or resource availability.

As discussed, certain storage resources, such as batteries, may function differently from other energy resources. For example, batteries may only be utilized for a limited amount of time during a given time period. Moreover, batteries may be depleted, and even exhausted, given power demands, or may cycle over long periods of time either alternating between charging and discharging, or charging or discharging at very low levels relative to the maximum charging and discharging rates. Additionally, batteries may be heavily subject to environmental or operational conditions. For example, the hotter or colder the environment, the less efficiently a battery may operate.

Accordingly, creating dispatch plans for batteries in a grid can be a complicated and error prone process at least because of the complexity of the rules imposed by an ISO, the plurality of different types of markets in which the batteries may be deployed or made available, and the wide number of other variables involved, including real-time variables such as those associated with the battery itself including battery performance and cycle-life, environmental variables, operating periods or states, and market conditions Therefore, in order to effectively decide (1) where to best locate a battery storage facility in an electric grid, and (2) when is the best time to deploy this energy storage resource (e.g., production or consumption of power to or from the grid), the state of charge and cycle-life technical parameters should be carefully and systematically accounted for in combination with external events occurring on a second-to-second basis in real-time, including operating actions undertaken by the grid's ISO as well as continuous changes in grid conditions. As shown by the approaches previously described, absent a methodology to manage the state of charge and cycle-life within the uncertain operating environment over time, a battery storage facility may be operated in a sub-optimal fashion, thereby inefficiently managing its performance and accelerating diminishment in its overall calendar life.

What is desired, therefore, are systems and methods for the management of the dispatch and lifecycle of energy storage systems on an electrical grid. Specifically, what is desired are such systems and methods that incorporate a range of historical and real-time technical, locational, temporal, and economic parameters into battery system management, enabling the determination of what is an optimal use of the battery system in a particular location at a particular point in time and management of the battery system to achieve the determined optimal use.

SUMMARY

To address those concerns discussed above, among others, embodiments of an energy storage resource management system are disclosed. These energy storage management systems may take as input electricity grid parameters, market rules, and technical parameters and generate instructions for a particular time period (e.g., for increments of five minutes, an hour, a day, etc.) for one or more energy storage system to store (consume energy from the grid) or release energy (produce energy to the grid) at a particular time and in a particular quantity in accordance with optimization of a particular goal such as cycle-life management, charge maintenance or revenue maximization.

To determine the instructions for the energy management systems, embodiments of an energy storage management system may generate a model based on the input electricity grid variable datasets (where the datasets utilized may be based on historical data, forecast or projected data, or other datasets), and technical parameters and solutions (e.g., instructions) for optimization of the goal associated with such data. The model generated from such data can then be applied to recent, current or forecast data for the parameters (e.g., electrical grid parameters and technical parameters) in order to generate instructions for optimization of the associated goal for a future time period.

The data associated with one or more of the parameters can be updated at some time interval (e.g., real-time, 5-minutes, hourly, daily, etc.) and the model (re)applied to the data for the parameters to generate updated or current instructions for optimization of the associated goal in a future time period. Moreover, the historical data (e.g., associated with a result relative to the associated goal) for a previous time period may be obtained and utilized to improve or regenerate the model itself, thereby improving the efficacy of the energy storage management system.

Embodiments of energy storage management systems as disclosed herein may thus incorporate a range of electricity grid variables, operational specifications, technical parameters or other variables to determine the optimal use of an energy storage system at any point time. In one embodiment, for example, to mitigate the risk of future uncertainty in grid conditions, external data across a range of time horizons from five minutes to forty-eight hours (or more) may be incorporated. By assessing the interaction of these external and technical or other factors (e.g., associated with the battery system under management), embodiments can determine the optimal operating actions for the energy storage system, thereby generating instructions to store (consume energy from the grid) or release energy (produce energy to the grid) at a particular time and in a particular quantity in order to manage the state of charge or achieve and optimize another goal. Embodiments may therefore recalculate the operating decision or instructions for one or more energy storage systems on a daily (or more/less frequent) basis at least to (a) provide a daily schedule for energy storage operation in line with operational parameters, including regulatory requirements to participate in deregulated electrical markets or grid systems, and (b) to allow consistent management and tracking of energy storage system usage in line with cycle-life limitations.

Accordingly, embodiments may facilitate the deployment of energy storage systems across a wide variety of applications on an electricity grid by implementing a methodology which incorporates and solves for a greater range of variables in battery energy storage operational decisions. Such systems may thus allow owners or operators of energy storage resources to optimize the performance and calendar life of their energy storage resources by deploying embodiments to generate and provide instructions regarding the best use of the system under future grid conditions.

Embodiments will also enable owners or operators to (1) offer a wider range of useful services to the grid, and thus compete with more traditional electric generating resources, and (2) select what is the most effective use of the energy storage system for any given time period, reducing the need to decide in advance how the system will be used. Moreover, the operators of the electricity grids themselves will benefit from the increased range of services available from battery energy storage systems that employ embodiments as disclosed. These services can be instructed directly by the operators according to rules (which may include market rules or the like) or can be self-selected and self-managed by the battery system based upon prevailing grid conditions. In one embodiment, therefore, energy storage management system 180 may create dispatch plans for one or more batteries. These dispatch plans may be optimized for a particular goal (such as cycle-life management, charge maintenance, revenue maximization, etc.) that accounts for myriad variables, where the dispatch plan contains instructions or conditions designating the availability (e.g., times, power output, price conditions, etc.) of a battery in a particular market for one or more intervals during that (e.g., future) time period. These dispatch plans may specify a committed-operation schedule or an availability-for-operation schedule.

In particular, embodiments of an energy storage management system may determine and evaluate a number of options for a dispatch plan for a battery to optimize a particular goal, where each dispatch plan for a battery for a future time period may correspond to a different market or a combination of markets (e.g., DAM, RTM, AS market) in which the battery may be made available in the future time period and where the time intervals during the time period over which the availability and conditions of the battery are specified are relatively granular (e.g., on the order of minutes or hours rather than days).

BRIEF DESCRIPTION OF THE DRAWINGS

The drawings accompanying and forming part of this specification are included to depict certain aspects of the invention. A clearer impression of the invention, and of the components and operation of systems provided with the invention, will become more readily apparent by referring to the exemplary, and therefore nonlimiting, embodiments illustrated in the drawings, wherein identical reference numerals designate the same components. Note that the features illustrated in the drawings are not necessarily drawn to scale.

FIG. 6 is a table of exemplary technical parameters in accordance with some embodiments of the present disclosure.

FIG. 7 is a table of exemplary operating states in accordance with some embodiments of the present disclosure.

FIG. 8 is a table setting forth energy market-market transactions available for consideration to exemplary operating states in accordance with some embodiments of the present disclosure.

FIG. 9 is a table setting forth MW-conversion calculations in accordance with some embodiments of the present disclosure.

FIG. 10 is a table setting forth additional MW-conversion calculations in accordance with some embodiments of the present disclosure.

FIG. 11 is a table setting forth exemplary dispatch-model time periods and corresponding timestamps in accordance with some embodiments of the present disclosure.

FIG. 12 is a table setting forth operating-state time intervals in accordance with some embodiments of the present disclosure.

FIG. 13 is a table setting forth exemplary price variables in accordance with some embodiments of the present disclosure.

FIG. 14 is a table setting forth exemplary margin variables in accordance with some embodiments of the present disclosure.

DETAILED DESCRIPTION

Nonlimiting embodiments of the present invention and the various features and advantageous details thereof are explained more fully, with reference to the accompanying drawings, and detailed in the following description. Descriptions of well-known starting materials, processing techniques, components and equipment are omitted so as not to unnecessarily obscure the invention in detail. It should be understood, however, that the detailed description and the specific examples, while indicating some embodiments of the invention, are given by way of illustration only and not by way of limitation. Various substitutions, modifications, additions and/or rearrangements within the spirit and/or scope of the underlying inventive concept will become apparent to those skilled in the art from this disclosure.

Figure 1:
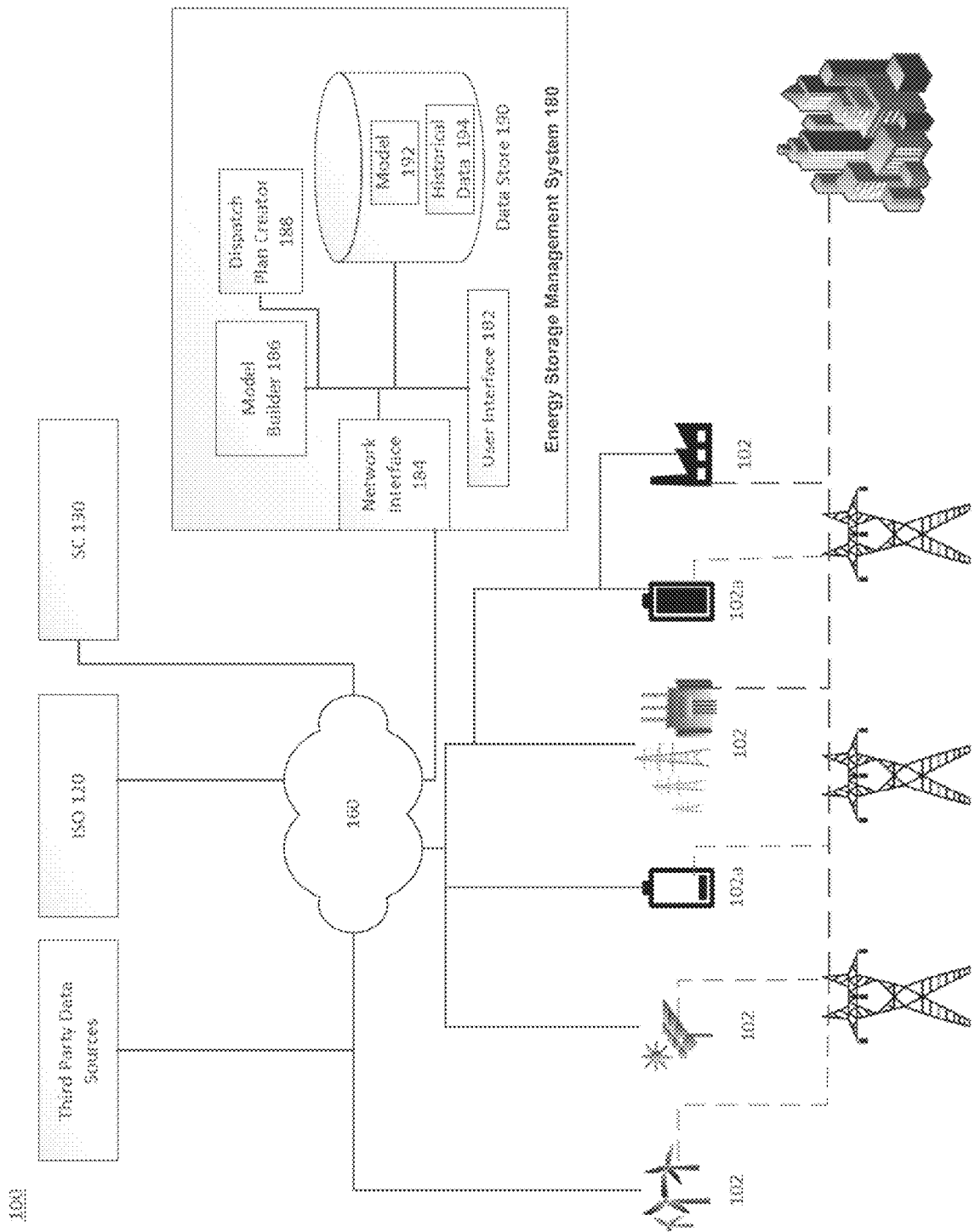
FIG. 1 is a diagram of one embodiment of a topology of an electrical grid including and embodiment of an energy storage management system.

To provide additional context for the various embodiments, an example topology for an electrical grid, in which such embodiments of an energy storage management system may be deployed, is here described. Turning to FIG. 1, a block diagram of an embodiment of an energy storage management systems integrated into the topology of an electrical grid is depicted. Here, electrical grid 100 is an interconnected network of electrical resources for delivering electricity from producers to consumers.

The electrical grid 100 may thus include geographically distributed energy resources 102 which may produce (e.g., generate) electricity to provide electricity into the electrical grid 100 or consume electricity from the grid 100. These energy resources 102 on the electrical grid 100 may include energy storage systems 102*a*. An energy storage system 102*a* may be capable of both producing energy to provide into the grid and consuming energy to store such energy for later provisioning into the grid 100. The energy stored by an energy storage system 102*a* may be consumed from the electrical grid 100 itself or from another source coupled to the energy storage system 102*a* (which may, or may not, be coupled directly to the electrical grid 100), such as solar panels, wind turbines or the like.

A battery energy storage (BES) system is one example of such an energy storage system 102*a*. Other examples are possible and are fully contemplated herein, as mentioned previously. Thus the terms battery energy storage and battery system are used herein interchangeably with the term energy storage system without loss of generality. Regardless of underlying battery chemistry, each battery energy storage (BES) system will incorporate the same basic design and may be housed in, for example, custom-build standalone warehouses or multiple standard shipping-size containers.

Such a battery system includes the battery itself, which must be housed in some sort of container or warehouse, a Power Conversion System ('PCS') or inverter which may interface the DC battery system to the AC power system; and the Controls Software Energy Management System ('EMS'), which operates as the system decision-maker for the battery by monitoring, governing and executing the actions of the BES such that it performs the functions of a governing energy storage application.

A BES may also include Balance of Plant ('BOP') elements including the grid connection infrastructure such as transformers, switchgear, metering etc. These auxiliary systems may all communicate directly with the BES Control system which may be governed by a system-level of master controller. A key BOP element is the HVAC which maintains the battery environment within permitted temperature limits. These BES components may be integrated to provide an energy storage system ready for connection to the electricity grid, either through direct grid connection or 'behind-the-meter' of an existing electricity end-user.

In the context of their deployment in electrical grid 100 these batteries 102a may function differently from other energy resources 102. Many energy resources 102, such as typical generators, may provide or generate electricity substantially on-demand (e.g., assuming undisrupted availability of their fuel-source). Batteries 102a in a BES system may, however, only be utilized to charge or discharge for a limited amount of time during a given time period, that is, until they are either fully charged or fully discharged, and recognizing that they may charge and discharge on an interim basis as determined to optimize BES system function.

Accordingly, the ISO 120 and energy resources 102 may be coupled using a secured electronic communication network 160 such as the Internet, an internet, an intranet, or a wireless or wireline network of some combination of computer networks. A dispatch plan for each energy resource 102 on the grid may be submitted to the ISO 120 on a time period basis containing instructions or conditions designating the availability (e.g., times, power output, price conditions, etc.) of the energy resource 102 for one or more intervals during that (e.g., future) time period. In some cases, this dispatch plan may specify, or be associated with, the market in which the resource 102 is going to operate for the time period and there may be one or more dispatch plans corresponding to a particular market. The dispatch plan may thus need to conform to the rules or regulation promulgated by the ISO 120.

The ISO 120 may receive these dispatch plans and, during the time period, send (or not send) operational instructions to the energy resources 102 based on the associated dispatch plan, grid conditions (e.g. the need to maintain system reliability whilst dispatching sufficient power to meet system demand) and the market conditions (e.g., the need to reliably satisfy system demand for electricity on the grid 100 as cost-effectively as possible). The energy resources 102 can then provide electricity to the grid 100 or store electricity from the grid 100 in accordance with any instructions received from the ISO 120.

For example, a storage resource 102a may submit a dispatch plan that includes a firm schedule of availability to operate in certain hours and up to a certain number of megawatts during an upcoming time period ('committed-to-operation') or indicating that the storage resource 102a may be deployed by the ISO 120 at any time during the following day, and up to any volume of energy (subject to a maximum value) as specified in the dispatch plan for the energy resource 102 depending on price and conditions of grid 100 during each operating interval (e.g., which may be on the order of 5 minutes, 10 minutes, 30 minutes, 1-hour, etc.) ('availability-for-operation').

In particular, electronic communications between an ISO 120 and the energy resources 102 may be facilitated through scheduling entity 130 (also referred to as a scheduling coordinator or SC). SC 130 may be unaffiliated with the energy resources 102 or may be operated by or affiliated with one or more of the energy resources 102, depending on a particular ISO's regulations. SC 130 may be coupled to the electronic communication network 160 and be adapted to communicate electronically with both ISO 120 and storage resources 102. Dispatch plans associated with an energy resource 102 may be provided to the ISO 120 through the SC 130.

During a particular time period then, the energy resource 102 on the grid may pass real-time operational data to the ISO 120 through computer network 160 via SC 130. Such data can be passed, for example, through a Supervisory Control and Data Acquisition (SCADA) interface. ISO 120 sends all day-ahead commitments, real-time deployment instructions or real-time market information to each energy resource 102 via SC 130 (which may, again, be accomplished through a SCADA interface). For example, real-time data may be exchanged between ISO 120 and resources 102 through SC 130 ISO on a 2-to-4 second frequency.

Thus, the energy storage management system 180 may be utilized to evaluate the potential future operation of a battery 102a at a particular location (e.g., for which service would battery 102a be most frequently used—DA, HA, RT or AS markets or some combination thereof) and the implications for battery 102a usage, asset revenue, and battery life. For example, energy storage management system 180 may generate a dispatch schedule for an active asset in a deregulated market, outlining available megawatt volumes and bid or offer price submissions in line with prevailing market protocols, subject to energy storage management system 180's determinations regarding requirements of other variables affecting the storage system.

In certain instances, the energy storage management system 180 may identify one or more markets in which a battery 102a may operate for the future time period and create a dispatch plan optimized for the desired goal for each of the one or more markets, where the dispatch plan may include instructions or availability for the battery 102a for each of a number of granular intervals (e.g., 5 or 10 minutes) during the time period. One of the dispatch plans for the markets may then be selected and provided to the ISO 120 for a future time period. This selection may be done automatically by the energy storage management system 180 based on an optimization criterion, or may be done for example, by a user through an interface of the energy storage management system 180.

To facilitate the creation of these types of dispatch plans, energy storage management system 180 may include a user interface 182, a computer network interface 184 such as a SCADA interface or the like, a model builder 186 and a dispatch plan creator 188.

Model builder 186 may receive and store historical data (e.g., through computer network interface 184) and store the historical data 194 in a local data store 190. This historical data may include technical or operational data on the batteries 102a; historical third party data such as weather or other environmental data, grid 100 outages or contract information; historical ISO data including historical market prices and instructions on deployment of batteries 102a; or historical data on operating periods such as charging or discharging constraints.

The model builder 186 can then construct model 192 from the historical data 194 stored in the data store 190 and store the model 192 for future application. The model 192 may be configured to optimize one or more goals (e.g., an output variable) according to one or more input variables including battery constraints 102a, forecast data or market conditions, and may take the form of a linear regression or linear discriminant analysis, mixed integer programming problem, a decision tree, Naïve Bayes, K-Nearest Neighbors, Neural Network such as Learning Vector Quantization, Support Vector Machine, Random Forest model or another type of model.

In one embodiment, model 192 may be linear programming tool or model which comprises a series of algorithms based upon the technical battery parameters; external ISO inputs; third party forecasting data; operating periods; operating states; and which may account for manual adjustments (that may be input through, for example, user interface 182). The model may also be based on the parameters (or other data) for other batteries or other energy resources in the electric grid 100. The technical battery parameters may encompass parameters based upon operating limits within the system set by either (a) technology constraints, or (b) warranty use conditions. External ISO inputs may incorporate all of the market data provided by the ISO to the battery 102a, including historical pricing and battery 102a performance information. Such data may be, for example, provided via the SC 130 to an interface (e.g. SCADA) associated with the battery 102a, and stored within the data store 190.

Third party forecasting data may include data regarding (i) future Day-Ahead market/Real-Time market/Ancillary Service prices, (ii) expected generation flows from local generators, (iii) local transmission outages or potential congestion events, and (iv) expected local weather temperatures or other conditions. Operating period data may include data setting the time-horizons for which the battery 102a will decide how much and when to charge and discharge (e.g., typical electricity market timelines are 5-minutes, 15-minutes and 1-hour, depending on the particular market design). Operating state data may define the range of operating states or scenarios available for battery 102a operation across the different ISO services in a particular electricity market. Given the limited duration of power available (a function of the type of storage technology deployed in the battery 102a), the selection of which ISO market to participate in is a key operational decision, impacting both operating life and profitability of the battery 102a. Manual adjustments may allow for ad-hoc changes to accommodate real-life operating conditions which may not be reflected in other data stored in the data store 190 such as a percentage of the battery 102a capacity that may be offline for maintenance in a given time period.

During operation then, the energy storage management system 180 may obtain current data for a (e.g., future) time period (e.g., through computer network interface 184) for a battery 102a. This current data may include data on the set (or a superset or subset) of the parameters used to construct model 192. Dispatch plan creator 188 can then apply model 192 to the current data for the battery 102a. In particular, embodiments of energy storage management system 180 may determine and evaluate a number of options for a dispatch plan for a battery 102a to optimize a particular goal, where each dispatch plan for a battery 102a for a future time period may correspond to a different market or a combination of markets as permissible under the market rules (e.g., DAM, HA, RTM, AS market) in which the battery 102a may be made available in the future time period and where the time intervals during the time period over which the availability and conditions of the battery 102a are specified are relatively granular (e.g., on the order of minutes or hours rather than days).

In certain instances, the dispatch plan creator 188 may identify one or more markets in which a battery 102a may operate for the future time period and create a dispatch plan optimized for the desired goal for each of the one or more markets, where the dispatch plan may include instructions or availability for the battery 102a for each of a number of granular intervals (e.g., 5 or 10 minutes) during the time period.

Specifically, in one embodiment, dispatch plan creator 188 generates a series of results which determine what is the optimal operating profile for the next operating day for the battery 102a, with the objective to identify what is the most valuable use of the battery 102a on the grid 100 based upon the DA, HA, RT and AS market inputs; maximize the potential economic outcome of the battery 102a whilst adhering to battery state of charge and warranty criteria for that battery 102a and evaluate the impact of daily operation on the expected cycle-life of that battery 102a or of other batteries 102a in the electrical grid 100.

The dispatch plan creator 188 can then determine MW-allocation, by determining preferred operating hours and revenue outcomes for each operating state. Dispatch plan creator 188 may identify infeasible operating states (e.g., it may not be possible to operate in the RT-energy market for example if there is no sensible sequence to charge the battery 102a before discharging it). Dispatch plan creator 188 can then determine the expected power usage (e.g., kW, kWh, mW, mWh, etc.) for each operating state. Following evaluation of each operating state outcome, the dispatch plan creator 188 can determine the optimal operating state profile or plan for the following time period (e.g., day) is identified. This dispatch plan sets the intended hours for the battery 102a for either (a) committed-operation, or (b) availability-for-operation depending on real-time ISO actions.

The dispatch plan for the battery 102a may then be selected and provided to the ISO 120 for a future time period (e.g., through the SC 130). This selection may be done automatically by the energy storage management system 180 based on an optimization criterion, or may be done for example, by a user through an interface of the energy storage management system 180.

Figure 2:
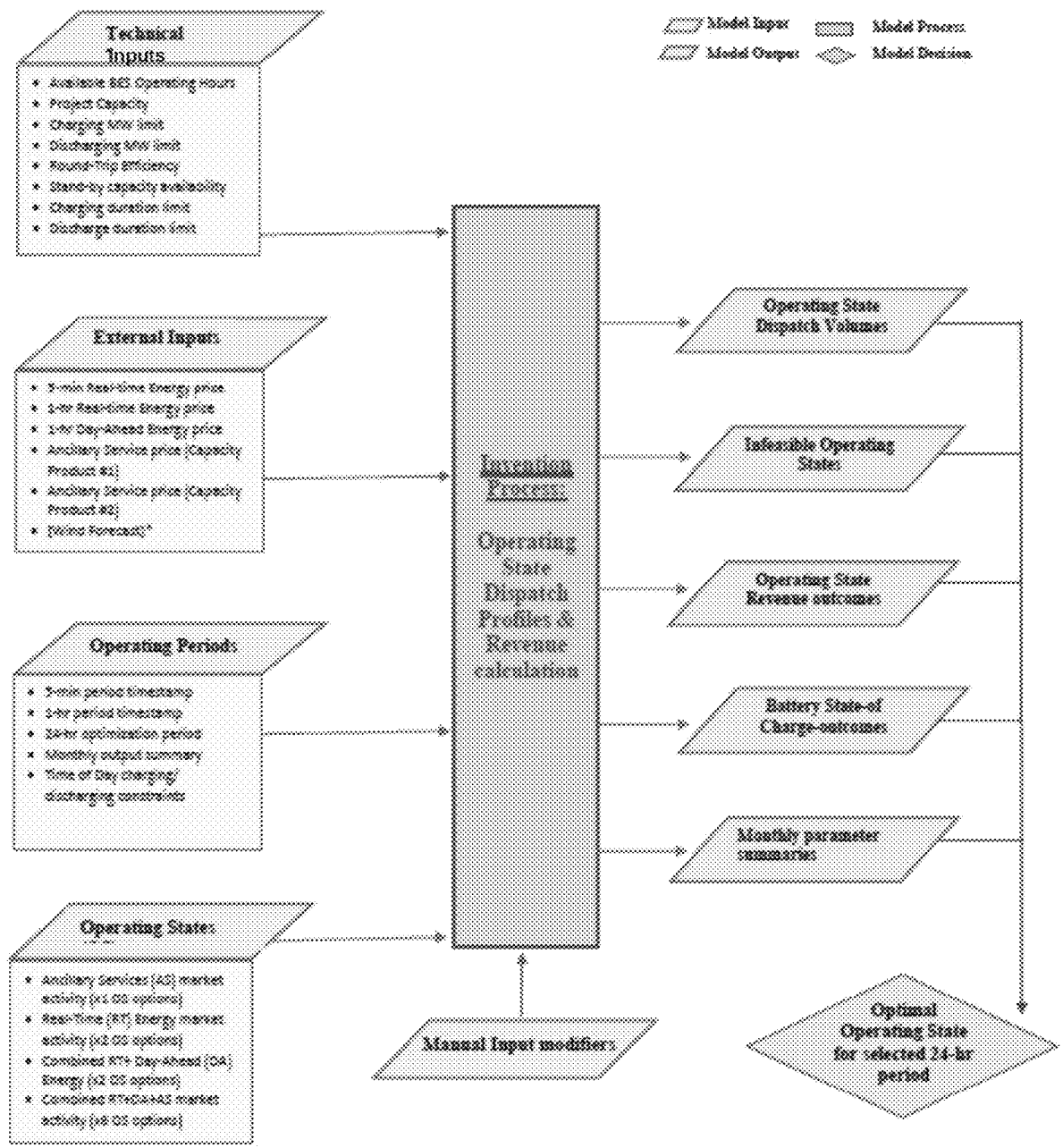
FIG. 2 is a diagram of one embodiment of a model.
Figure 3:
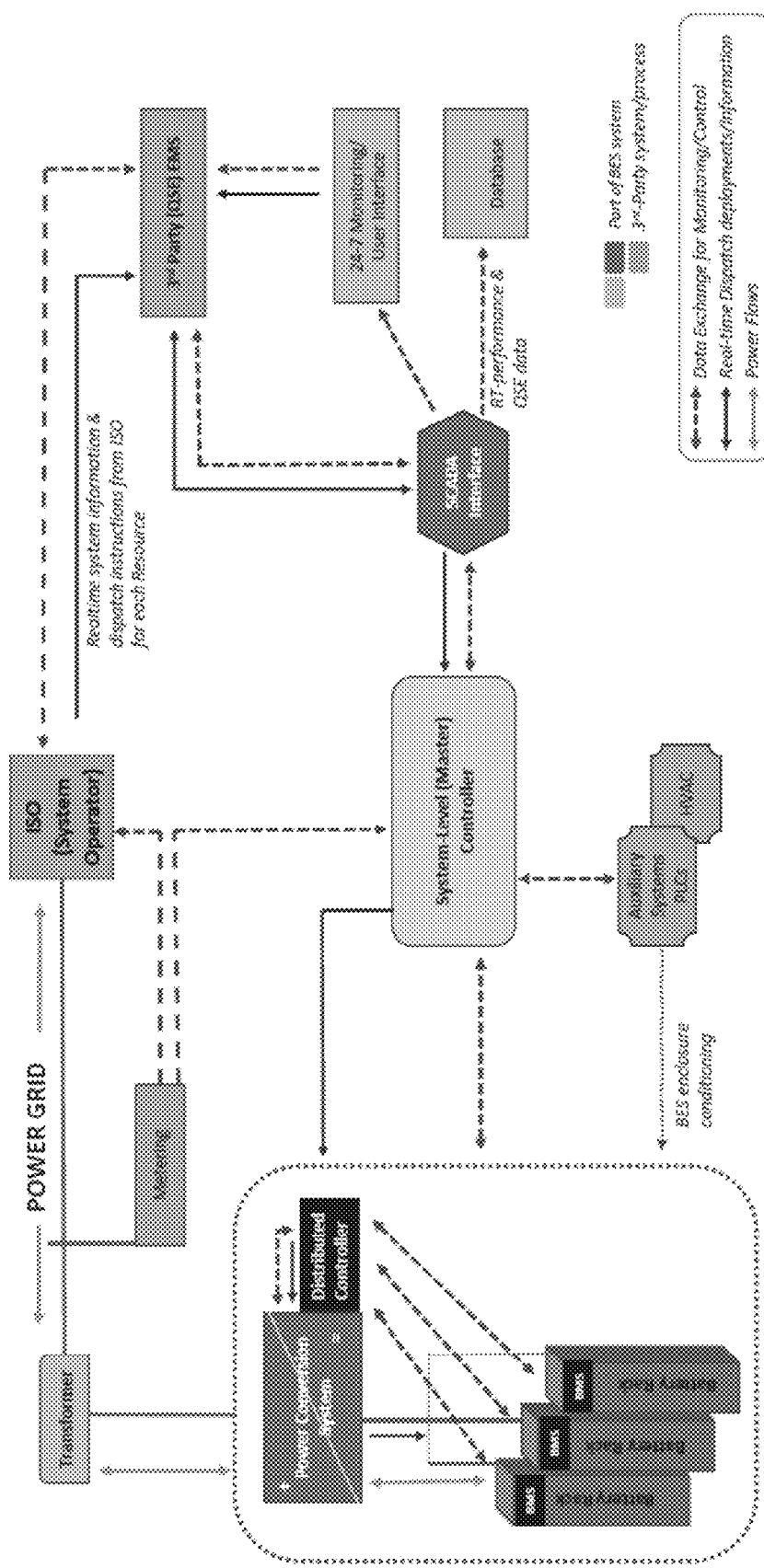
FIG. 3 is a flowchart depicting a prior art system for managing energy dispatch.
Figure 4:
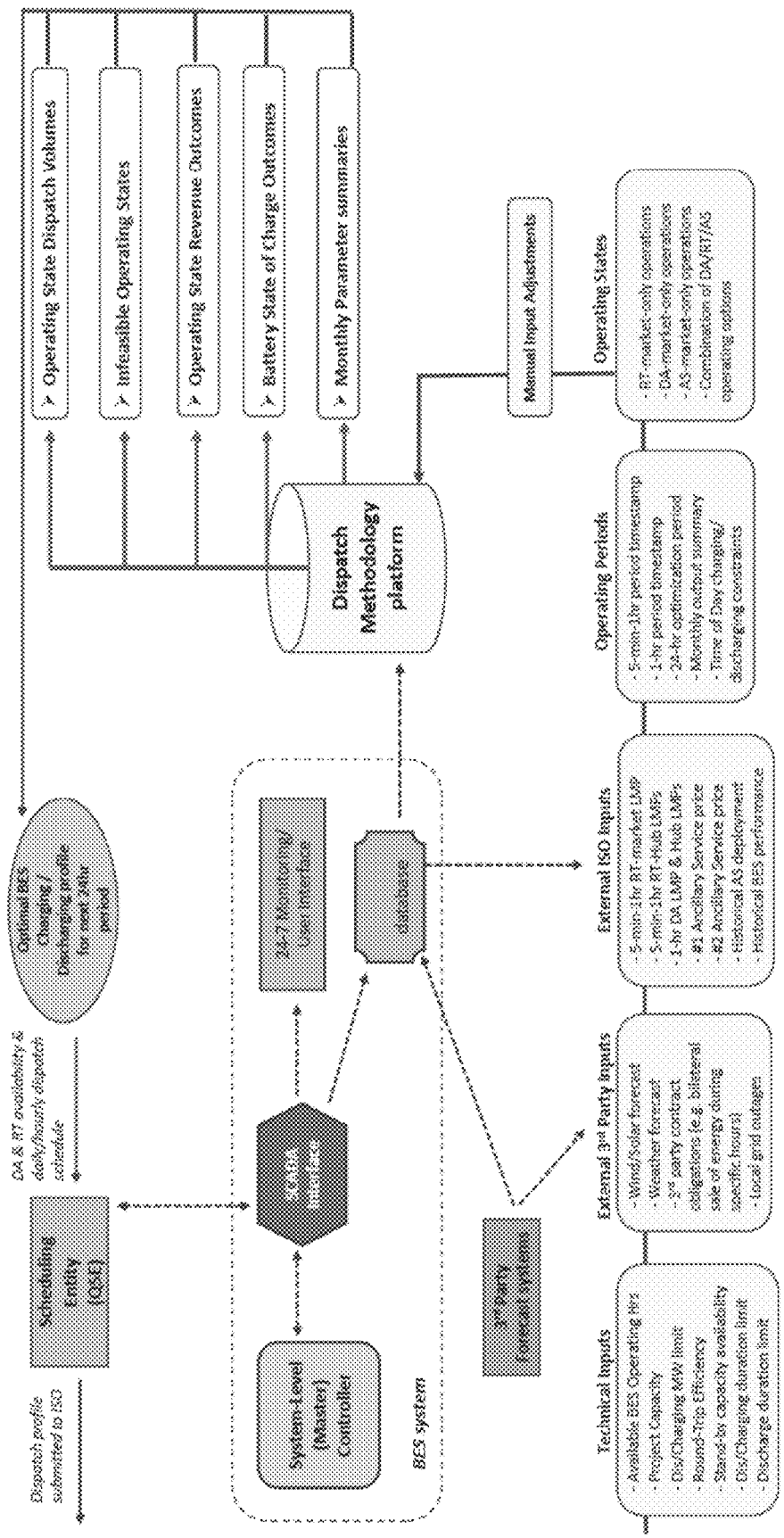
FIG. 4 is a flowchart depicting a system for managing energy dispatch of a single BES system in accordance with some embodiments of the present disclosure.
Figure 5:
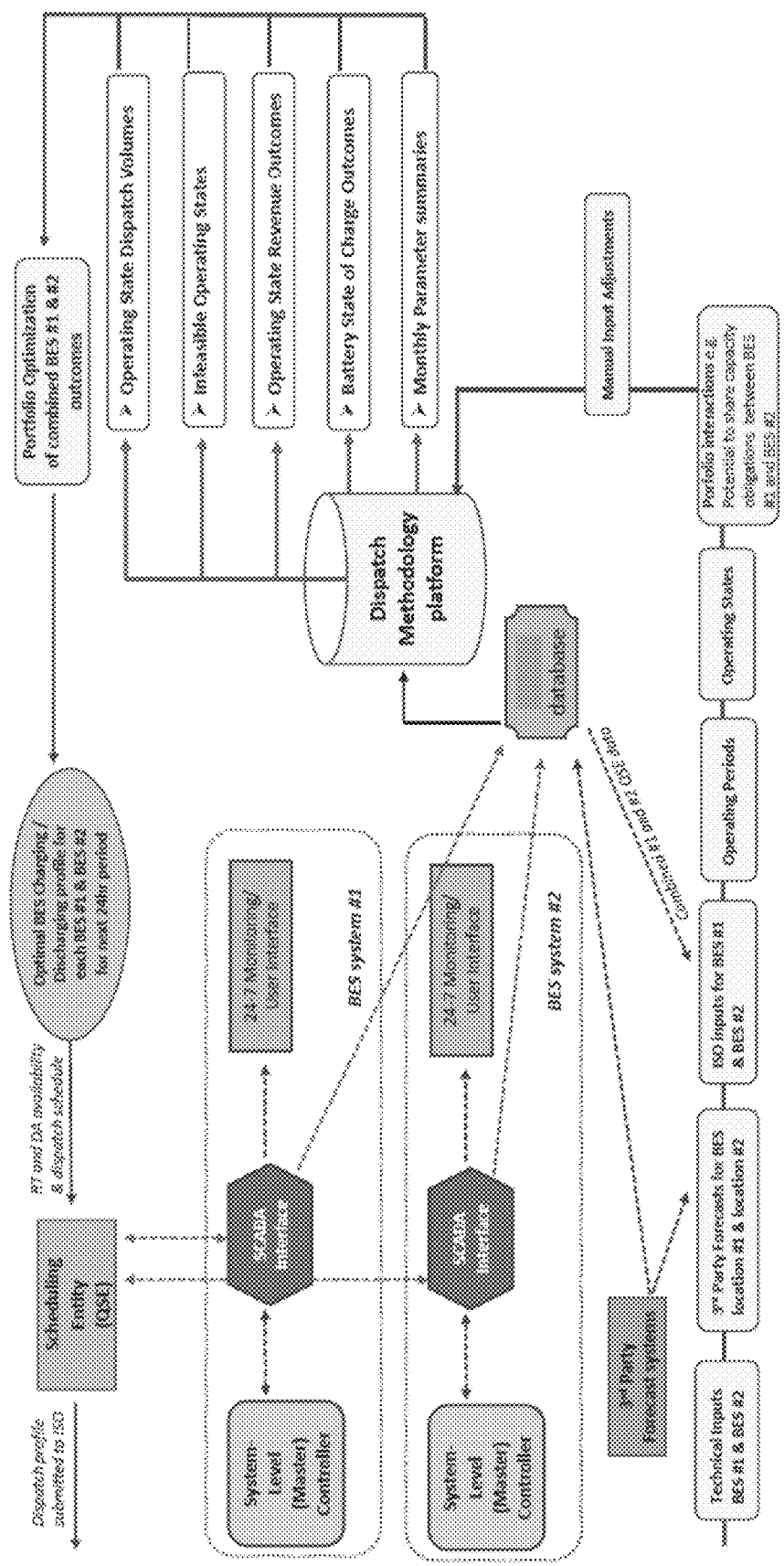
FIG. 5 is a flowchart depicting a system for managing energy dispatch of multiple BES systems in accordance with some embodiments of the present disclosure.

It will now be useful to depict one embodiment of a model that may be employed by embodiments of an energy storage management system. Looking then at FIG. 2, a block diagram depicting one embodiment of a model and the usage of such a model is presented. Embodiment of such a model may include a set of interlocking algorithms which incorporate a range of external and internal operating parameters to set boundary conditions for battery charge and discharge decisions. The external conditions include, for example, grid frequency, time of day restrictions on battery charging/discharging, weather forecasts, 5-minute prices for charging/discharging energy at a specific location on the system, hourly prices for charging/discharging energy at a specific location on the system, hourly system-wide capacity prices for up to three, and potentially more, types of ancillary services (alternatively known as 'capacity products') available in the said market, five-minute time intervals over each operating period (the default operating period is 24-hours), and hourly time intervals over each operating period. Technical parameters may include, for example, nameplate capacity of the battery facility, round-trip efficiency loss factor between charging and discharging, maximum energy limits for battery charging/discharging, available duration for sustained battery charging/discharging at its maximum level, and limitations on the number of cycles that the battery system may undertake on a single day.

A plurality of different operating states may be defined for use with the model. These operating states are defined by the type of services that the battery system can deploy in the electricity market at any point in time, and as may be permitted by the specific market design of each electricity grid or the ISO operating the grid. For a particular battery or set of batteries, embodiments may utilize the model to solve or optimize a goal for each of these different operating states, subject to the technical conditions above, by identifying charging/discharging profiles for a battery system for a time period (e.g., a day) which would function in each operating state. Embodiments may also identify any operating state which is not feasible on a given day (e.g., this may occur if the best battery response to external factors (such as price) may breach technical parameters (such as the limit on maximum charging/discharging).

In one specific embodiment, to assess the optimal Operating State for the day embodiments may maximize the financial return of each charging/discharging profile of a battery system throughout the day, subject to the parameters of the model, including the external and internal technical parameters. By solving for the maximum financial return, embodiments may include the most efficient charging & discharging profile for the battery system for each interval (e.g., 5-minute interval) in the time period (e.g., day), and ensures that the battery system is not operated in a sub-optimal performance manner which may limit its overall effectiveness as a utility-scale grid asset.

In these various embodiments, model builder 186 may include any software or other programmatic structure capable of producing model 192, or other series of instructions, incorporating the variables discussed above. Similarly, dispatch plan creator 188 may include any software or other programmatic structure capable of utilizing model 192 alongside data corresponding to the variables accounted for in model 192.

For embodiments in which model 192 is, as discussed previously, a set or series of algorithms or other logical instructions, dispatch plan creator 188 may be any program or software configured to execute those algorithms or instructions on relevant data that is accessible by such program or software.

Some embodiments, at least partially through dispatch plan creator 188 executing on model 192: (a) compute optimal hourly dispatch for battery 102a; and (b) provide a data repository which stores historical data, including historical pricing data, historical forecast data, operating data, etc., and the results of model 192 as applied to current data.

In one embodiment, model 192 takes the form of a Microsoft Excel-based model configured to computer hourly dispatch instructions and calculate the resulting revenues at various electrical nodes within an energy market. At the core of this model are instructions and logic that are exemplary of the requirements for model 192. In further embodiments, model 192 may take the form of instructions or other logical operations programmed as executable code, or into other software capable of executing such instructions and operations, such as dispatch plan creator 188, thereby creating a more flexible platform with superior data management and computational capabilities than an Excel-based solution particularly when modelling multiple operating scenarios, or states, at various pricing intervals including 5-minute intervals.

Certain embodiments of model 192, including Excel-based embodiments, may be configured to be applied to data points representing technological parameters of a specific BES system, such as system duration, round-trip efficiency, and state-of-charge restrictions; as well as economic information from an energy market including (i) energy market price datasets defined over sixty-, fifteen-, and five-minute intervals, and (ii) Ancillary Service (capacity) market prices defined over sixty- and fifteen-minute intervals. Model 192 is designed to facilitate the calculation of revenue outcomes based upon these datasets and the determination of the optimal dispatch outcome based on a set of technical conditions, the range of revenue outcomes available, and the set of possible market combinations allowed under market rules.

Dispatch plan creator 188 may be configured to calculate, by executing model 192, dispatch outcomes for a selected dispatch period wherein said dispatch period may be a 24-hour operating day. This allows for a user to make advance scheduling decisions for the next operating day. Selected dispatch periods may additionally be set, or made optionally selectable by a user, as an hourly, daily, monthly, or annual interval. As a result, calculations at different intervals and analyses of various operating scenarios may be performed, and a user may then make adjustments or changes to assumptions over these intervals in view of the results of such calculations and analyses.

To facilitate execution of model 192, dispatch plan creator 188 is configured to receive data originating from other systems such as an ISO settlements system and third-party forecasting systems. In the embodiments described herein, dispatch plan creator 188 is not part of a BES system directly but rather is a standalone system intended to generate outputs that may then be uploaded to third party systems that affect, or are otherwise integrated with, a BES system (such as the BES control system) or third-party market-scheduler systems.

In certain embodiments, model 192 is configured to enable calculations based on a set of technical parameters, operating state parameters (including calculated, market-specific MW allocations and related conversions as discussed below), pricing data, and operating limits data. As a BES system is designed to charge and discharge electric power based on transactions in an energy market, it is critical to consider not only physical limitations of the BES system but also data related to the particular market(s) that the BES system may serve.

As depicted in the table of FIG. 6, the technical parameters may include physical limitations of a particular BES system. These parameters represent values that restrict a BES system's ability to charge or discharge. Values for each parameter may be supplied directly by a user for a given BES system. Accordingly, these values are not statically programmed into model 192. These values may be pulled by dispatch plan creator 188 (for example, from a local data store, user-input, or through communication with a third-party data provider) when executing model 192 and may be updated by the user for given market scenarios. Certain technical parameters may not be solely based on this user-supplied data and may instead result from calculations on this or other data, as described below.

To facilitate generation of revenue outcomes, operating state parameters may be incorporated into model 192. These operating state parameters are designed to account for potential engagement of a BES system in the Real-Time (RT) energy market, the Day-Ahead (DA) energy market, and/or the Ancillary Service (AS) market. Operating state parameters may include a plurality of defined operating states that simulates allocating energy commitments to the various markets according to a set of limitations unique from those of the other operating states.

Sample operating state limitations, which assist in generating an operating profile representative of a BES system's commitments made in accordance with such limitations, may include:

(1) Buying (charging) and/or discharging (selling) energy in the DA energy market;
(2) Buying (charging) and/or discharging (selling) energy in the RT energy market;
(3) Allocating capacity to the Ancillary Service markets;
(4) Some combination of 1-3.

When model 192 is executed, as part of the calculations, each defined operating state is used to generate a schedule according to that operating state's limitations. This schedule represents the intended operating profile of a BES system performing in a particular operating state. A schedule may include:

(1) The time intervals in the following 24-hour day that the BES system will be active in each market (over hourly/fifteen-minute/five-minute intervals depending on the market); and
(2) The number of MWs that are allocated to each market.

As each energy market has its own specific conditions or limitations, such conditions may be incorporated into each operating state as needed. For example, an operating state that considers only RT energy market transactions need not incorporate, or otherwise account for DA energy market commitments.

Looking at the DA energy market specifically, it is important to note that scheduled DA energy market transactions are financially binding. When a BES system has decided "day-ahead" which hours to operate in the following 24-hour operating day, it will receive an hourly price for committing to these hours in advance. DA energy market committed hours, for an ultimately adopted schedule, should therefore be executed in real-time operations as charging/discharging actions as planned. In view of this binding commitment, any hours that are set aside in a schedule generated through execution of model 192 to charge/discharge in the DA energy market must be treated as restricted from use in other markets for any updated schedules—they may not be subject to commitment in any other market absent financial penalties for reneging on the earlier DA energy market commitment.

For example, if a 4-hour BES system has scheduled in the DA market to "sell" energy between the hours of 13:00-17:00, then in real-time operation the BES system should have energy available to discharge between 13:00-17:00. The BES system could not also schedule to sell physical energy in the RT market during the hours of 15:00-19:00 in the event that it has discharged its full 4-hour capacity between 13:00-17:00 under its DA market obligation. In this case, in order to be able to make itself fully available to sell energy again in the RT market, the BES system would immediately have to start charging after its DA market obligation ended at 17:00 to be ready to discharge into the RT market later in the evening.

Operating state schedules that involve potential transactions in the DA energy market are further limited by DA price constraints during execution of model 192 by dispatch plan creator 188. Specifically, if the DA price constraints are not satisfied, then the schedule is considered "not feasible," and the MWs are available to trade in other energy markets. Price constraints are discussed in greater detail below.

An operating state may also be defined such that transactions in the AS market are evaluated when generating a schedule. The AS market designates a commitment by the BES system to withhold capacity from the energy market in order to be available for system support if required the following day. Like DA energy market commitments, commitments to the AS market are financially binding. AS market commitments are also similarly limited by AS price constraints.

A BES system, however, may divide its total capacity into portions that are committed to the different markets at the same time. For example, a BES system may commit 75% of its available capacity to sales in the DA energy market and 25% of its available capacity in the AS market for the same time interval. Within the AS market, a BES system may commit to more than one ancillary service during a single hour. Model 192 may be configured to accommodate the presence of numerous ancillary services and to be updated for inclusion of even further ancillary services.

For embodiments in which model 192 features operating states accommodating numerous ancillary services, dispatch plan creator 188 may accept user-input that: selects which ancillary services to apply for a particular market; select the appropriate time-interval for each ancillary service product (hourly or fifteen-minute); and selected how many ancillary service products may be allocated MWs in each time-period.

Operating states defined to include RT energy market transactions may proceed to generate a schedule with or without hourly RT energy market commitments. If a schedule includes hourly RT energy market commitments, MWs so committed may not be committed to other markets during the already-committed hours. Similar to DA energy market and AS market commitments, hourly RT energy market commitments are limited by RT price constraints. If a schedule does not include hourly RT energy market commitments, in an operating state that accounts for potential RT energy market transactions, any MWs set aside for allocation to the RT energy market may not be utilized in either the DA energy market or AS market though these MWs may only represent a fraction of a BES system's total available capacity (similar to the percentage split previously discussed). This is because those MWs must be available for use in the RT energy market. Rather than rely on hourly commitments, such a schedule instead identifies the best five-minute intervals for charging/discharging in real-time operations over a 24-hour day based on RT energy market price forecasts. The BES system will be instructed to perform these identified charge/discharge operations subject to operating constraints (RT market price constraints, state of charge constraints, and cycling constraints).

For every DA or RT energy market commitment in a given schedule, a corresponding "real-time" operation action is simulated by dispatch plan creator 188 when executing on model 192. For example, if a schedule contains a 10-MW DA sell between 13:00-17:00 and an 8-MW RT buy between 19:00-23:00, these commitments will be translated into corresponding charge and discharge actions that will be captured by the SOC counter that tracks such real-time operations. Charging and discharging a BES system can never exceed the SOC counter limits set out in model 192 regardless of whether the transaction is a DA or RT energy market commitment.

Energy storage management system 180 may be further configured to monitor activity related to AS commitments made in advance to similarly reflect such commitments as real-time operations for purposes of updating the SOC counter.

While operating state definitions have been discussed generally, FIG. 7 sets forth a number of exemplary operating states and their respective scheduling logic. The operating states considered in model 192 may be revised or supplemented as needed—for example, adding additional operating states or limiting the hours available for charge/discharge in one or more operating states. FIG. 8 provides an overview of which energy markets are considered in the operating states set out in FIG. 7.

FIGS. 9 and 10 describe, in accordance with certain embodiments, the variables and calculations utilized to build model 192, to determine maximum MW-allocation to each energy market, and to, in further embodiments, convert relevant datasets to match a specified time interval.

In certain embodiments, model 192 may be configured to account for variations in data input from different sources that may occur when model 192 is executed by dispatch plan creator 188. For example, certain calculations may require data for varying time intervals (five-, fifteen-, and sixty-minute). Energy market data, however, may only be provided in one time interval—an RT energy market forecast price given in hourly intervals. To accommodate this reality, model 192 may include instructions or other logic to convert data to be usable in a given calculation such as by breaking down hourly pricing into twelve, five-minute intervals to track charging/discharging operations. Timestamps in model 192 may follow the conventions for "hour-ending" (HE) and "interval-ending" (IE) as set forth in FIG. 11.

Charging and discharging schedules may be tracked as MW charged/discharged on an hourly basis. For example, a "9 MW DA-sell between 13:00-15:00" corresponds to discharging 9 MW every hour within the time interval. Every hourly schedule may be converted into real-time charging and discharging operations. Regardless of whether the schedule is a DA or RT energy market transaction, and absent other constraints preventing real-time operations from executing the hourly schedule in five-minute intervals, charging and discharging operations, reflecting the hourly schedules, may be tracked in MWh on a five-minute basis. Taking the same sell discussed previously, this corresponds to 0.75 MWh every five minutes within the time interval. AS market commitment may be tracked on an hourly basis without conversion to five-minute charge/discharge operations. FIG. 12 illustrates a manner of tracking charge/discharge operations in accordance with several embodiments.

Energy storage management system 180 may be configured to accept pricing datasets into local memory storage and to allow for selection of appropriate datasets for use with model 192. FIG. 13 is a list of pricing datasets that may be used by dispatch plan creator 188 when executing model 192. Each market option in an operating state defined in model 192 has a corresponding specific market price. Dispatch plan creator 188 calculates the costs/revenues for buying/selling MWs in each market utilizing the relevant specific market prices as applied to model 192. Revenue may be calculated from the BES system's perspective generally as follows:

Discharge Income=Discharge Capacity×Market Price
(wherein a negative Market Price will yield a negative Discharge Income value)
Charging Cost=−1×(Charging Capacity×Market Price)
(wherein a negative Market Price will yield a positive Charge Cost)
Ancillary Service Market Capacity is only selected where AS prices are positive. Energy storage management system should never select an outcome having a negative AS price. In all operating states, the selection of charge/discharge hours will seek to minimize charging costs and maximize discharging income subject to the BES system's operating limits.

In one embodiment, when calculating the projected outcome for each operating state, dispatch plan creator 188 simulates allocating charging and discharge MWs to those time periods which will result in the least cost and maximum revenues utilizing the relevant specific market prices as applied to model 192.

In certain embodiments, operating limits data includes data representing MWs available to buy/sell (hereinafter referred to as X). Hourly MWs available to buy/sell in each operating state cannot exceed the volumes as set forth in FIG. 10. Operating limits data may further include available duration (hereinafter Y) entered by a user and that represents the maximum numbers of minutes that the BES system can sustain full capacity in either a charge/discharge direction. Energy storage management system 180 does not have to schedule operating minutes (or hours) consecutively—the BES system may be instructed to alternate between charging and discharging so long as the SOC counter constraint is satisfied. Operating limits data may further include an SOC counter that is applied to ensure that the energy discharged from the BES can never exceed the available energy in the BES, and the amount of energy that is used to charge the BES can never exceed the amount of spare capacity remaining in BES. In embodiments utilizing the operating states set out in FIG. 7, for operating states 1-8, the value of the SOC counter for discharging can never exceed the value of the SOC counter for charging. Any excess SOC counter charges are carried forward into the next operating day and applied as a percent reduction on the next operating day's first cycle of charging quantities. For operating states 9-14, the value of the SOC counter for charging can never exceed the value of the SOC counter for discharging.

Operating limits data may further include SOC percentage that tracks the energy available for discharge in the BES as a percentage of total BES capacity. Operating state calculations must satisfy any SOC percentage maximum/minimum thresholds which may be specified by the user.

Operating limits data may further include Cycle-Limit (hereinafter C). A BES system cycle is defined by one full BES discharge (to minimum capacity) plus one full BES charge (to maximum capacity). The default cycle limit is one cycle per day.

One Cycle=Y×2

Energy management storage system 180 may be configured to provide the user an option to set the daily C up to two decimal places (such as C=1.75) thereby allowing an extended dispatch schedule on any given day in the event that price forecasts indicate this to be an economically advantageous decision. As an example, a 4-hour battery with C=1.5 may entail an operating pattern of charging for four hours, discharging for four hours, and charging for four hours.

Operating limits data may further include time of day (hereinafter TD) restrictions. Energy storage management system may be configured to allow users to select certain hours during which specified charging or discharging operations are prohibited. For example, charging may be prohibited before HE-7, discharging prohibited after HE-20, or both charging and discharging prohibited between HE-15 and HE-19. TD restrictions may be specific to a selected operating state, and energy storage management system 180 may be configured to allow a user to select which operating state(s) to which TD restrictions apply. Moreover, a TD restriction may only apply for one day (or some other specified number of dispatch periods).

Operating limits data may further include price margin (hereinafter M) restrictions. Dispatch plan creator 188 may select to discharge MWs in the DA or RT energy markets only during those hourly or five-minute intervals during which the relevant market price is discharge exceeds a strike price (charge price plus a designated market margin). Energy storage management system 180 may be configured to allow a user the enter DA and RT energy market price margins for each operating day. For example, the user may enter two dollar-per-MWh margins per market—an operating margin and a discount margin. The operating margin applies by default although a user may select either margin to apply on a given day. The DA and RT energy market price margins will roll into the next operating day automatically unless modified by the user. In certain embodiments, the user may select if the basis for the strike price is an average dollar-per-MWh charging price from the market selecting in the underlying operating state or the maximum dollar-per-MWh discharging price. FIG. 14 provides exemplary calculations of strike prices.

Across several embodiments, datasets must be input by a user or collected from other sources. Such datasets may be gathered, or otherwise input into energy storage management system 180, from those third party suppliers known in the art. These datasets may include: pricing data sets, technical datasets, and operating state datasets.

Pricing datasets may include:
(1) ISO Hourly Price Data—for the DA energy market (specific BES nodes and ISO-hubs), wherein each DA energy market record contains 24 records each day of a year, and for the AS market (ISO-markets), wherein each AS market record contains 24 records each day of a year;
(2) ISO 5-minute Interval Price Data—for the RT energy market (specific BES nodes and ISO-hubs), wherein each RT energy market records contains 288 records each day of a year;
(3) ISO 15-minute Settlement Price Data—Market Settlement report (specific BES nodes and ISO-hubs), wherein each settlement record contains 96 records each day of a year; and
(4) Forecast Hourly Price Data—for the DA energy forecast (specific BES nodes and ISO-hubs), the RT energy forecast (specific BES nodes and ISO-hubs), and the AS forecast (ISO markets), wherein each forecast contains 24 records each day of a year.

If the optimal operating state determined by dispatch plan creator 188 relied on forecast hourly price data, energy storage management system 180 may provide the user with an ability to compare forecast optimal operating state, actual optimal operating state, and scheduled optimal operating state on any given day. This allows users to review actual outcomes as compared to the modelled outcome and the "perfect" outcome based on after-the-fact knowledge gathered on the selected day.

Technical datasets may include:
(1) Battery Size Data (Nameplate MW, MWh, duration limits), wherein such data is entered by the user as fixed daily parameters;
(2) Efficiency and Loss Data entered by the user as fixed hourly parameters;
(3) SOC restrictions entered by the user as fixed daily parameters; and
(4) Long-term Usage Condition Data entered by the user as fixed daily/annual parameters.

Operating state datasets may include operating state definitions as previously described and any new operating states uploaded by the user into energy storage management system 180 or otherwise integrated into model 192.

In certain embodiments, model 192 utilizes an optimization function to identify the optimal operating state for a selected dispatch period (typically the following operating day). In certain embodiments, the optimization function is a subset of the algorithms comprising model 192. In other embodiments, the optimization function may be a set of algorithms or instructions executed by dispatch plan creator 188 upon the outcomes produced through model 192. The optimization function may involve evaluating the outcomes for each and every operating state. Once the evaluation is complete, an operating state is identified based on at least one selection criterion. This selection criterion may be maximum revenue. Additionally, the projections, or other results, for each operating state may be accessible, or otherwise displayed or presented, to the user. By evaluating each operating state and providing all results to the user, manual modification to the schedule ultimately generated by energy storage management system 180 is possible.

In further embodiments, energy storage management system 180 may be configured to allow for users to query available data stores, including data store 190, to review data stored therein. Energy storage management system 180 will be further configured to export Excel/CSV file formats of the queried results and save those results along with the corresponding queries. Queries may be able to fetch five-, fifteen-, and sixty-minute data and compare the results to other time intervals. Energy storage management system 180 may be even further configured to allow users to execute test scenarios in which model 192 may be applied by dispatch plan creator 188 to various user-specified technical and market parameters.

While the preceding embodiments are described for application to BES systems located in the Texas ERCOT NERC region, such embodiments may be similarly employed in other North American ISO electricity markets including PJM, MISO, SPP, NYISO, & NEPOOL as each of these regional markets presents a similar market design whereby a BES system may select to operate in either the DA, RT, or AS markets or any combination thereof.

Certain embodiments discussed herein can be implemented in suitable computer-executable instructions that may reside on a computer readable medium (e.g., a hard drive (HD)), hardware circuitry or the like, or any combination.

Hardware architecture for implementing certain embodiments is described herein. One embodiment can include one or more computers communicatively coupled to a network.

At least portions of the functionalities or processes described herein can be implemented in suitable computer-executable instructions. The computer-executable instructions may be stored as software code components or modules on one or more computer readable media (such as non-volatile memories, volatile memories, direct access storage drive (DASD) arrays, magnetic tapes, floppy diskettes, hard drives, optical storage devices, etc. or any other appropriate computer-readable medium or storage device). In one embodiment, the computer-executable instructions may include lines of compiled C++, Java, hypertext markup language (HTML), or any other programming or scripting code.

Additionally, the functions of the disclosed embodiments may be shared/distributed among two or more computers in or across a network. Communications between computers implementing embodiments can be accomplished using any electronic, optical, radio frequency signals, or other suitable methods and tools of communication in compliance with known network protocols.

As used herein, the terms "comprises," "comprising," "includes," "including," "has," "having" or any other variation thereof, are intended to cover a non-exclusive inclusion. For example, a process, product, article, or apparatus that comprises a list of elements is not necessarily limited only those elements but may include other elements not expressly listed or inherent to such process, product, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Additionally, any examples or illustrations given herein are not to be regarded in any way as restrictions on, limits to, or express definitions of, any term or terms with which they are utilized. Instead, these examples or illustrations are to be regarded as being described with respect to one particular embodiment and as illustrative only. Those of ordinary skill in the art will appreciate that any term or terms with which these examples or illustrations are utilized will encompass other embodiments which may or may not be given therewith or elsewhere in the specification and all such embodiments are intended to be included within the scope of that term or terms. Language designating such nonlimiting examples and illustrations includes, but is not limited to: "for example," "for instance," "e.g.," "in one embodiment."

Benefits, other advantages, and solutions to problems have been described above with regard to specific embodiments. However, the benefits, advantages, solutions to problems, and any component(s) that may cause any benefit, advantage, or solution to occur or become more pronounced are not to be construed as a critical, required, or essential feature or component.

The invention claimed is:

1. A system for managing energy dispatch comprising:
   a network interface for connecting with an electrical power grid;
   a dispatch schedule optimization platform, associated with the network interface, wherein the dispatch schedule optimization platform is configured to:
   determine a plurality of possible operating states of an energy system responsive at least in part to a plurality of operating parameters relating to the energy system connected to the electrical power grid;
   generate an outcome set comprising a projected outcome for each operating state of said plurality of possible operating states; and
   identify from said outcome set an optimal outcome for the energy system, wherein the optimal outcome comprises one of a first particular time to store electrical energy from the electrical power grid and a second particular time to provide electrical energy to the electrical power grid; and
   communicate the identified optimal outcome to a scheduling entity.

2. The system of claim 1, wherein said operating parameters comprise a set of technical specifications for said energy system and a set of energy market data.

3. The system of claim 2, wherein said set of energy market data comprises forecast pricing data.

4. The system of claim 2, wherein said dispatch schedule optimization platform is further configured to receive said set of energy market data from a remote source.

5. The system of claim 1, wherein said each operating state is defined by a set of energy market allocation preferences.

6. The system of claim 1, wherein said dispatch schedule optimization platform comprises a local memory and a user-input interface, wherein the plurality of operating parameters are stored in said local memory, and wherein a user may provide a set of technical specifications to said dispatch schedule optimization platform through said user-input interface.

7. A method for managing energy dispatch comprising:
   connecting with an electrical power grid including a plurality of energy resources via a network interface;
   determining a plurality of possible operating states of an energy system responsive at least in part to a plurality of operating parameters relating to the energy system connected to the electrical power grid using a dispatch schedule optimization platform associated with the network interface;
   generating an outcome set comprising a projected outcome for each operating state of said plurality of possible operating states using the dispatch schedule optimization platform;
   identifying from said outcome set an optimal outcome for the energy system, wherein the optimal outcome comprises one of a first particular time to store electrical energy from the electrical power grid and a second particular time to provide electrical energy to the electrical power grid using the dispatch schedule optimization platform; and
   communicating the identified optimal outcome to a scheduling entity.

8. The method of claim 7, wherein said operating parameters comprise a set of technical specifications for said energy system and a set of energy market data.

9. The method of claim 8, wherein said set of energy market data comprises forecast pricing data.

10. The method of claim 8 further comprising receiving said set of energy market data from a remote source using the dispatch schedule optimization platform.

11. The method of claim 7, wherein said each operating state is defined by a set of energy market allocation preferences.

12. The method of claim 7 further comprising storing the plurality of operating parameters are stored in a local memory associated with the dispatch schedule optimization platform.

13. The method of claim 7 further comprising receiving a set of technical specifications to said dispatch schedule optimization platform through a user-input interface associated with the dispatch schedule optimization platform.

14. A dispatch schedule optimization platform associated with an electrical power grid, comprising:
   a processor, wherein the processor is configured to:
   determine a plurality of possible operating states of an energy system responsive at least in part to a plurality of operating parameters relating to the energy system connected to the electrical power grid;
   generate an outcome set comprising a projected outcome for each operating state of said plurality of possible operating states; and
   identify from said outcome set an optimal outcome for the energy system, wherein the optimal outcome comprises one of a first particular time to store electrical energy from the electrical power grid and a second particular time to provide electrical energy to the electrical power grid; and communicate the identified optimal outcome to a scheduling entity.

15. The dispatch schedule optimization platform of claim 14, wherein said operating parameters comprise a set of technical specifications for said energy system and a set of energy market data.

16. The dispatch schedule optimization platform of claim 15, wherein said set of energy market data comprises forecast pricing data.

17. The dispatch schedule optimization platform of claim 15, wherein said processor is further configured to receive said set of energy market data from a remote source.

18. The dispatch schedule optimization platform of claim 14, wherein said each operating state is defined by a set of energy market allocation preferences.

19. The dispatch schedule optimization platform of claim 14 further comprising a local memory and a user-input interface, wherein the plurality of operating parameters are stored in said local memory, and wherein a user may provide a set of technical specifications to said dispatch schedule optimization platform through said user-input interface.

* * * * *